United States Patent
Shibata

(10) Patent No.: US 7,692,241 B2
(45) Date of Patent: Apr. 6, 2010

(54) SEMICONDUCTOR DEVICE

(75) Inventor: Takumi Shibata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/153,217

(22) Filed: May 15, 2008

(65) Prior Publication Data
US 2008/0283913 A1 Nov. 20, 2008

(30) Foreign Application Priority Data
May 17, 2007 (JP) .............. 2007-131504

(51) Int. Cl.
*H01L 49/00* (2006.01)
(52) U.S. Cl. .............. 257/341; 257/342; 257/491; 257/E49.001; 438/270
(58) Field of Classification Search ......... 257/341–342, 257/335–337, 328, 491–494, E49.001, E27.091, 257/E27.095, E27.096, E29.118, E29.274, 257/E29.313; 438/270, 268, 297, 478
See application file for complete search history.

(56) References Cited

U.S. PATENT DOCUMENTS

| 6,097,063 | A | 8/2000 | Fujihira |
| 6,294,818 | B1 | 9/2001 | Fujihira |
| 6,566,709 | B2 | 5/2003 | Fujihira |
| 6,627,948 | B1 | 9/2003 | Fujihira |
| 6,700,157 | B2 | 3/2004 | Fujihira |
| 6,720,615 | B2 | 4/2004 | Fujihira |
| 6,724,040 | B2 | 4/2004 | Fujihira |
| 6,734,496 | B2 | 5/2004 | Fujihira |
| 7,112,843 | B2 | 9/2006 | Takaishi |
| 7,399,677 | B2 | 7/2008 | Takaishi |
| 7,541,643 | B2 | 6/2009 | Ono et al. |
| 2005/0006717 | A1 | 1/2005 | Yamaguchi et al. |
| 2006/0138407 | A1 | 6/2006 | Yamaguchi et al. |
| 2006/0194392 | A1 | 8/2006 | Nagaoka |
| 2008/0102582 | A1* | 5/2008 | Takei .................. 438/270 |

FOREIGN PATENT DOCUMENTS

| JP | A-2004-072068 | 3/2004 |
| JP | A-2004-134714 | 4/2004 |

OTHER PUBLICATIONS

Office Action mailed Aug. 18, 2009 from the Japan Patent Office for the corresponding Japanese patent application No. 2007-131504 (English translation enclosed).

* cited by examiner

*Primary Examiner*—Victor A Mandala
*Assistant Examiner*—Whitney Moore
(74) *Attorney, Agent, or Firm*—Posz Law Group, PLC

(57) ABSTRACT

A semiconductor device includes a semiconductor substrate and a super junction structure on the substrate. The super junction structure is constructed with p-type and n-type column regions that are alternately arranged. A p-type channel layer is formed to a surface of the super junction structure. A trench gate structure is formed to the n-type column region. An n+-type source region is formed to a surface of the channel layer near the trench structure. A p+-type region is formed to the surface of the channel layer between adjacent n+-type source regions. A p-type body region is formed in the channel layer between adjacent trench gate structures and in contact with the p+-type region. Avalanche current is caused to flow from the body region to a source electrode via the p+-type region without passing through the n+-type source region.

19 Claims, 6 Drawing Sheets

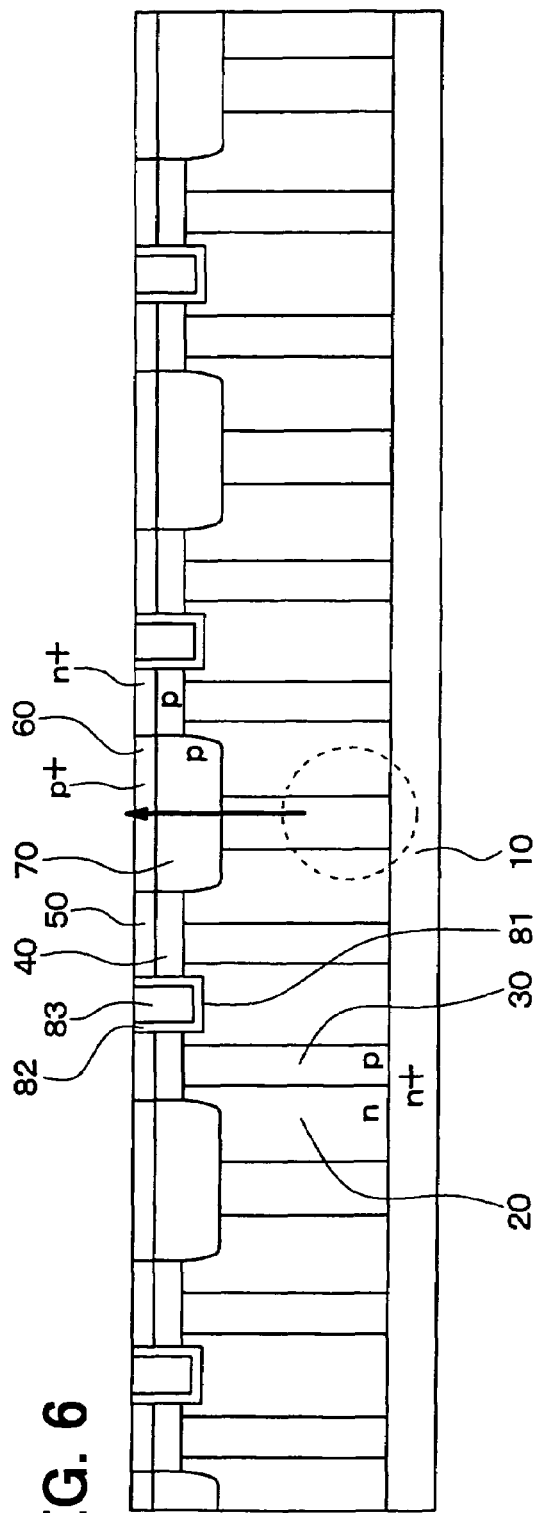
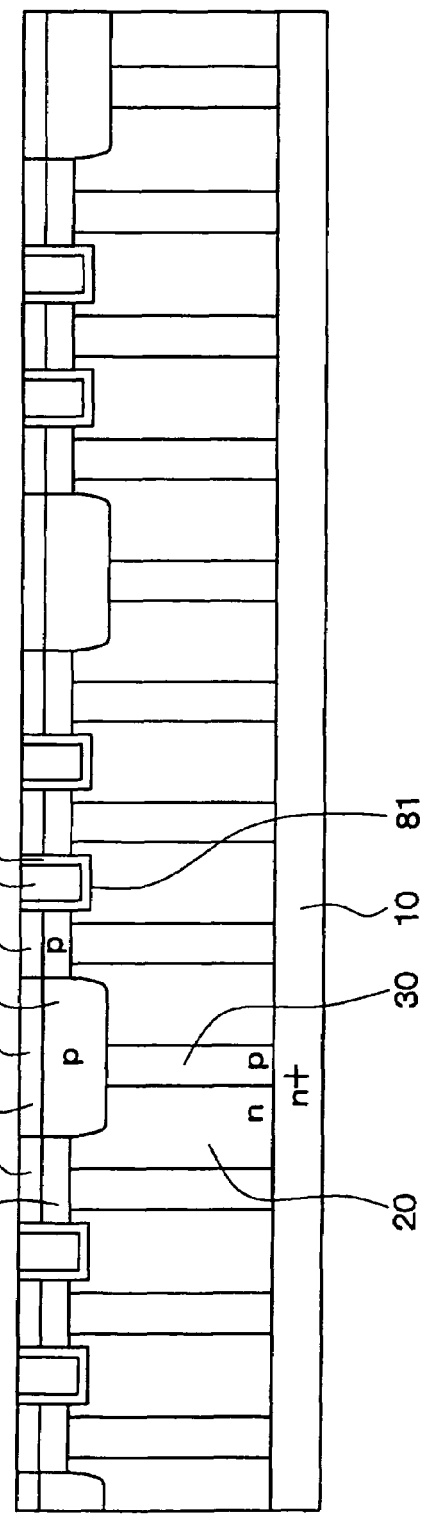
FIG. 6
FIG. 7

SEMICONDUCTOR DEVICE

CROSS REFERENCE TO RELATED APPLICATION

This application is based on and incorporates herein by reference Japanese Patent Application No. 2007-131504 filed on May 17, 2007.

FIELD OF THE INVENTION

The present invention relates to a semiconductor device having a trench gate type semiconductor element formed to a semiconductor substrate with a super junction structure.

BACKGROUND OF THE INVENTION

As disclosed in, for example, U.S. Pat. No. 6,734,496 corresponding to JP-A-H9-266311, a super junction metal oxide semiconductor field-effect transistor (MOSFET) has been proposed that achieves improved breakdown voltage and improved on-resistance. In the super junction MOSFET, a drift region is constructed with n-type drift regions and p-type compartment regions that are alternately arranged. Each of the p-type compartment regions is positioned between adjacent n-type drift regions to form a p-n junction. When the MOSFET is in an ON condition, a drift current flows through the n-type drift regions. In contrast, if the MOSFET is in an OFF condition, a depletion layer spreads out from each p-n junction between the n-type drift region and the p-type compartment region into the n-type drift region. In this case, since the depletion can be accelerated by laterally extending the outermost ends of the depletion region from both longitudinal sides of the p-type compartment region, the p-type compartment region is simultaneously depleted. Consequently, a breakdown voltage of the MOSFET becomes high. Further, on-resistance of the MOSFET can be reduced by increasing impurity concentration of the n-type drift region.

JP-A-2004-72068 and JP-A-2004-134714 disclose a technique for improving an avalanche capability of such a super junction MOSFET. In JP-A-2004-72068 and JP-A-2004-134714, the width or the impurity concentration of the n-type drift region and the p-type compartment region is adjusted so that electric field distribution in the p-n junction can be improved to increase the avalanche capability.

The super junction MOSFET disclosed in U.S. Pat. No. 6,734,496, JP-A-2004-72068, and JP-A-2004-134714 has a planar gate structure. In a super junction MOSFET with a trench gate structure, avalanche breakdown occurs directly below a trench gate. Therefore, an avalanche current flows to a source electrode by way of a channel layer on an outer side wall of a trench and a source layer. Since this avalanche current flow causes a parasitic bipolar transistor action, it is difficult to improve an avalanche capability of a super junction MOSFET with a trench gate structure.

SUMMARY OF THE INVENTION

In view of the above-described problem, it is an object of the present invention to provide a technique for improving an avalanche capability of a semiconductor device having a trench gate type semiconductor element formed to a semiconductor substrate with a super junction structure.

According to a first aspect of the present invention, a semiconductor device includes a first conductive type substrate, a super junction layer, a second conductive type channel layer, trench gate structures, first conductive type source region, a second conductive type third region, and a second conductive type body region. For example, the first conductive type is a n-type, and the second conductive type is a p-type. The super junction layer is disposed on the substrate and includes first conductive type first regions and second conductive type second regions. The first and second regions are alternately arranged in a plane direction of the substrate. The channel layer is formed to a surface portion of the super junction layer. Each trench gate structure includes a trench, a gate insulating layer, and a gate electrode. The trench penetrates through the channel layer and reaches a corresponding one of the first regions of the super junction layer. The gate insulating layer is disposed on an inner wall of the trench. The gate electrode is disposed in the trench through the gate insulating layer. The source region is formed to a surface portion of the channel layer and located near an outer side wall of the trench. The third region is formed to the surface portion of the channel layer and located between adjacent source regions. The third region has an impurity concentration greater than an impurity concentration of the channel layer. The body region is formed to the channel layer between adjacent trench gate structures and is in contact with the third region.

According to a second aspect of the present invention, the first and second regions of the super junction layer form multiple column structures. Each column structure includes one first region and one second region adjacent to the one first region. The trench gate structures are arranged in a first pattern and a second pattern. In the first pattern, one trench gate structure is formed to every column structure. In the second pattern, one trench gate structure is formed to every two or more column structures. The body region is formed to the channel layer between adjacent trench gate structures arranged in the second pattern.

According to a third aspect of the present invention, a plane direction of an interface between the first and second regions of the super junction layer is orthogonal to a length direction of the trench gate structure.

BRIEF DESCRIPTION OF THE DRAWINGS

The above and other objectives, features and advantages of the present invention will become more apparent from the following detailed description made with check to the accompanying drawings. In the drawings:

FIG. 6 is a diagram illustrating a cross sectional view of a semiconductor device according to a sixth embodiment of the present invention;

FIG. 7 is a diagram illustrating a cross sectional view of a semiconductor device according to a seventh embodiment of the present invention;

DETAILED DESCRIPTION OF THE PREFERRED EMBODIMENTS

First Embodiment

A super junction semiconductor device according to a first embodiment of the present invention is described below with reference to the drawings. For example, the semiconductor device can be used as a switching device for an inverter circuit.

Figure 1:
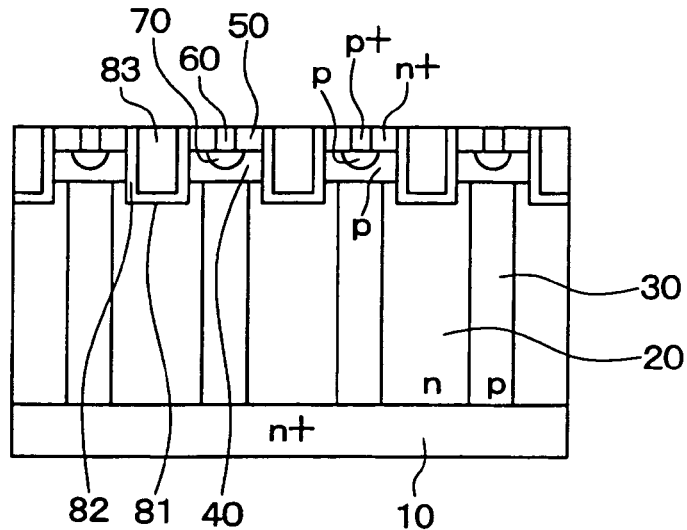
FIG. 1 is a diagram illustrating a cross sectional view of a semiconductor device according to a first embodiment of the present invention.

FIG. 1 is a diagram illustrating a cross-sectional view of the semiconductor device according to the first embodiment. As shown in FIG. 1, a column-shaped n-type region 20 and a column-shaped p-type region 30 are formed on a front surface of an n+-type substrate 10. The column-shaped n-type region 20 and the column-shaped p-type region 30 are alternately arranged in a plane direction of the substrate 10 to form a super junction structure (i.e., super junction layer). The column-shaped n-type region 20 and the column-shaped p-type region 30 are hereinafter called "n-column 20" and "p-column 30", respectively.

The substrate 10 has an impurity concentration of from about $1 \times 10^{19}$ cm$^{-3}$ to about $1 \times 10^{20}$ cm$^{-3}$. Each of the n-column 20 and the p-column 30 has an impurity concentration of from about $1 \times 10^{15}$ cm$^{-3}$ to about $1 \times 10^{16}$ cm$^{-3}$. The n-column 20 has a width of 1.7 micrometer (μm) in the plane direction of the substrate 10, and the p-column 30 has a width of 1.0 μm in the plane direction of the substrate 10. The number of n-type carriers in the n-column 20 is equal to the number of p-type carriers in the p-column 30 so that charge balance condition between the n-column 20 and the p-column 30 is matched.

By adapting a super junction structure to a semiconductor device in this way, a current can easily flow so that on-resistance can be small. Further, since the n-column 20 and the p-column 30 are alternately arranged, a depletion layer spreads over an interface between the n-column 20 and the p-column 30 so that an electric field is not concentrated in a specific portion. As a result, an electric field distribution between front and back electrodes of the semiconductor device becomes approximately uniform so that breakdown voltage can be increased. Thus, the super junction semiconductor device according to the first embodiment can achieve both low on-resistance and high breakdown voltage.

A p-type channel layer 40 is formed on a surface portion of the super junction structure formed with the n-column 20 and the p-column 30. For example, the p-type channel layer 40 has an impurity concentration of from about $1 \times 10^{16}$ cm$^{-3}$ to about $5 \times 10^{16}$ cm$^{-3}$. An n+-type source region 50 is formed opposite to the n-column 20 across the p-type channel layer 40, and a p+-type region 60 is formed opposite to the p-column 30 across the p-type channel layer 40. For example, the p+-type region 60 has an impurity concentration of from about $1 \times 10^{19}$ cm$^{-3}$ to about $1 \times 10^{20}$ cm$^{-3}$.

The p-type channel layer 40 has a p-type body region 70 that is in contact with the p+-type region 60. For example, the p-type body region 70 has an impurity concentration of from about $1 \times 10^{16}$ cm$^{-3}$ to about $1 \times 10^{19}$ cm$^{-3}$.

A trench 81 reaches the n-column 20 by penetrating through the n+-type source region 50 and the p-type channel layer 40. An inner wall of the trench 81 is covered with a gate insulating film 82, and a gate electrode 83 is formed in the trench 81 through the gate insulating film 82. Thus, the trench 81, the gate insulating film 82, and the gate electrode 83 form a trench gate structure. Each p-type body region 70 is located between adjacent trench gate structures.

In the first embodiment, a length direction of the trench 81 is orthogonal to an arrangement direction in which the n-column 20 and the p-column 30 are alternately arranged, so that a plane direction of an interface between the n-column 20 and the p-column 30 is parallel to the length direction of the trench 81. One trench gate structure is formed to each column structure that consists of one n-column 20 and one p-column 30 located adjacent to the one n-column 20.

The trench gate structure and a portion of the n+-type source region 50 are covered with an insulating film (not shown). Source electrodes (not shown) are electrically coupled to the n+-type source region 50 and the gate electrode 83, respectively. A drain electrode (not shown) is formed on a back surface of the substrate 10 to be in contact with the back surface.

A method of making the semiconductor device according to the first embodiment is described below. Firstly, the n+-type substrate 10 is prepared, and the n-column 20 and the p-column 30 are formed on the substrate 10. Specifically, an n-region is epitaxially grown on the substrate 10, and then a trench reaching the substrate 10 is formed in the n-region by a dry etching technique such as reactive ion etching (RIE). As a result, a plurality of n-columns 20 is formed on the substrate 10, and adjacent n-columns 20 are spaced from each other by the trench.

Then, a p-type region is epitaxially grown in the trench between adjacent n-columns 20, and then a surface of the p-type region is polished by a chemical mechanical polishing (CMP) technique. As a result, the n-column 20 and the p-column 30 are alternately arranged on the substrate 10 so that the super junction structure is formed. Then, the p-type channel layer 40 is formed on a surface portion of the super junction structure by an epitaxially growth technique or a p-type impurity ion doping technique.

Next, the trench gate structure is formed. A resist is formed on the p-type channel layer 40 and then patterned to form an opening in a position corresponding to the n-column 20. Then, the trench 81, which reaches the n-column 20, by penetrating through the p-type channel layer 40, is formed by a dry etching technique such as RIE.

Then, the gate insulating film 82 is formed on the inner wall of the trench 81 by a thermal oxidation technique, a chemical vacuum deposition (CVD) technique, or the like. Then, the gate electrode 83 is formed by forming polysilicon on the gate insulating film 82.

Then, a photoresist is formed on the p-type channel layer 40 and patterned to form an opening in a position corresponding to the p-type body region 70, and a p-type impurity ion doping is applied to the p-type channel layer 40. Likewise, an n-type impurity ion doping is applied to the surface portion of the p-type channel layer 40 near the trench 81 to form the n+-type source region 50. A p-type impurity ion doping is applied to the surface portion of the p-type channel layer 40 (i.e., directly above the p-type body region 70) between the n+-type source regions 50 to form the p+-type region 60. Then, a thermal diffusion is performed so that the n+-type source region 50, the p+-type region 60, and the p-type body region 70 can be formed. Thus, the semiconductor device shown in FIG. 1 is completed.

In the semiconductor device according to the first embodiment, an avalanche current flows as follows. When a breakdown occurs in the n-column 20, an avalanche current flows from the n-column 20 to the p+-type region 60 located on the p-type body region 70 by way of the p-column 30 located adjacent to the n-column 20, the p-type channel layer 40 located on the p-column 30, and the p-type body region 70 located in the surface portion of the p-type channel layer 40. Thus, since a resistance of the p-type body region 70 is less than a resistance of the p-type channel layer 40, the avalanche current flows from the p-type channel layer 40 to the p+-type body region 70. In contrast, when a breakdown occurs in the p-column 30, an avalanche current flows from the p-column 30 to the p+-type region 60 by way of the p-type channel layer 40 and the p-type body region 70.

In summary, the avalanche current flowing out from the n-column 20 reaches the p+-type region 60 and does not flows to the n+-type source region 50. Therefore, a path over which the avalanche current flows is not a NPN conductive type current path. Thus, even when the avalanche current flows in the semiconductor device due to the breakdown occurring in the n-column 20, the avalanche current does not cause a parasitic bipolar transistor action. The avalanche current flowing out from the p-column 30 always flows through a p-type region. Thus, even when the avalanche current flows in the semiconductor device due to the breakdown occurring in the p-column 30, the avalanche current does not cause a parasitic bipolar transistor action. In this way, the semiconductor device achieves an improved avalanche capability by causing the avalanche current to flow to the p+-type region 60 by way of the p-type body region 70.

As described above, in the semiconductor device according to the first embodiment, the p-type body region 70 is formed to the surface portion of the p-channel layer 40 in such a manner that the p-type body region 70 is in contact with the p+-type region 60. In such an approach, the avalanche current occurring in the semiconductor device flows to the p+-type region 60 by way of the p-type body region 70. As a result, even when the breakdown occurs in the semiconductor device, the parasitic bipolar transistor action does not occur so that the semiconductor device can have an improved avalanche capability.

Further, the semiconductor device according to the first embodiment employs the super junction structure. Therefore, the semiconductor device can have not only an improved avalanche capability but also high breakdown voltage and low on-resistance.

Second Embodiment

A super junction semiconductor device according to a second embodiment of the present invention is described below with reference to FIG. 2. Differences between the first and second embodiments are as follows. In the first embodiment, one trench gate structure is formed to each column structure, which consists of one n-column 20 and one p-column 30 located adjacent to the one n-column 20. In the second embodiment, one trench gate structure is formed to every multiple column structures.

Figure 2:
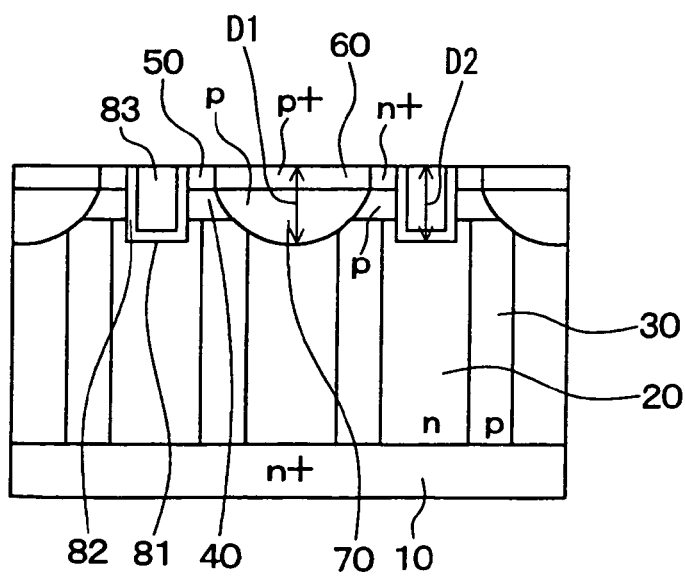
FIG. 2 is a diagram illustrating a cross sectional view of a semiconductor device according to a second embodiment of the present invention.

FIG. 2 is a diagram illustrating a cross-sectional view of the semiconductor device according to the second embodiment. As shown in FIG. 2, an n-column 20 to which a trench gate structure is formed and an n-column 20 to which a trench gate structure is not formed are alternately arranged. In other words, one trench gate structure is formed to every two column structures. Therefore, spacing between adjacent trench gate structures is twice spacing between adjacent column structures. The n-column 20 to which the trench gate structure is formed is hereinafter called "first n-column 20", and the n-column 20 to which the trench gate structure is not formed is hereinafter called "second n-column 20".

A p-type body region 70 is formed in a p-type channel layer 40 between adjacent trench gate structures. In the second embodiment, the p-type body region 70 reaches the column structure by penetrating through the p-type channel layer 40.

The p-type body region 70 is in contact with the second n-column 20 and also in contact with a p-column 30 located between the first and second n-columns 20. A depth D1 of the p-type body region 70 is greater than a depth D2 of a trench 81 of the trench gate structure. As shown in FIG. 2, each depth D1, D2 is measured from a surface of the semiconductor device. A p+-type region 60 is formed on the p-type body region 70.

In the semiconductor device according to the second embodiment, an avalanche current flows as follows. When a breakdown occurs in the first n-column 20 to which the trench gate structure is formed, an avalanche current flows from the first n-column 20 to the p+-type region 60 by way of the p-column 30, which is located adjacent to the first n-column 20 and the p-type body region 70, which is in contact with the p-column 30. In contrast, when a breakdown occurs in the p-column 30 located adjacent to the first n-column 20, an avalanche current flows from the p-column 30 to the p+-type region 60 by way of the p-type body region 70, which is in contact with the p-column 30.

Since the p-type body region 70 is deeply formed and in contact with the p-column 30, the avalanche current can flow to the p-type body region 70 without passing through the p-type channel layer 40.

As described above, in the semiconductor device according to the second embodiment, the spacing between adjacent trench gate structures is greater than the spacing between adjacent column structures. In other word, one trench gate structure is formed to every multiple column structures. In such an approach, the second n-column 20 to which a trench gate structure is not formed can exist. The p-type body region 70 is formed in the p-type channel layer 40 on the second n-column 20. Therefore, the p-type body region 70 of the second embodiment can have larger size and depth as compared to that of the first embodiment. Thus, since the avalanche current can easily flow to the p-type body region 70, the semiconductor device can have an improved avalanche capability.

Third Embodiment

Figure 3A:
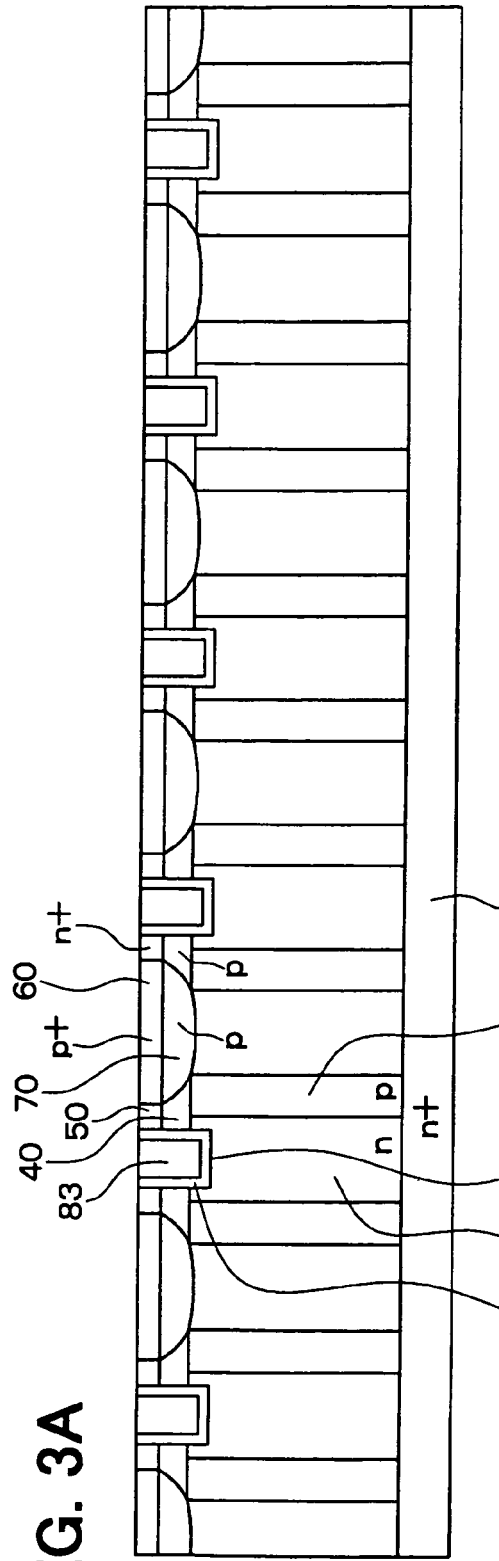
FIG. 3A is a diagram illustrating a cross sectional view of the semiconductor device of FIG. 2.

A super junction semiconductor device according to a third embodiment of the present invention is described below with reference to FIGS. 3A, 3B. Differences between the second and third embodiments are as follows. In the second embodiment, as shown in FIG. 3A, the spacing between adjacent trench gate structures is twice the spacing between adjacent column structures. In the third embodiment, as shown in FIG. 3B, spacing between adjacent trench gate structures is more twice spacing between adjacent column structures.

Figure 3B:
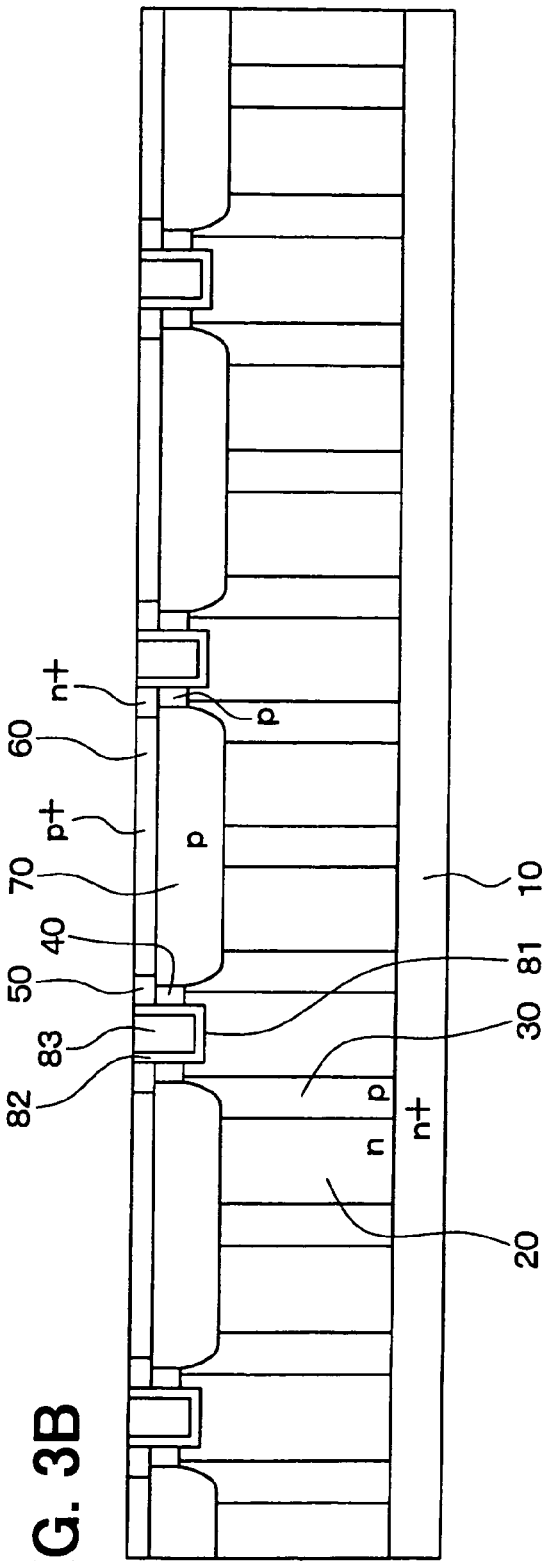
FIG. 3B is a diagram illustrating a cross sectional view of a semiconductor device according to a third embodiment of the present invention.

For example, as shown in FIG. 3B, in the third embodiment, the spacing between adjacent trench gate structures is three times the spacing between adjacent column structures. In such an approach, two second n-columns 20 can be located between adjacent trench gate structures. Therefore, a p-type body region 70 of the third embodiment can have larger size and depth as compared to that of the second embodiment.

As the area for the p-type body region 70 is larger, the p-type body region 70 can be deeply formed. Also, as the spacing between adjacent trench gate structures is larger, the area for the p-type body region 70 can be larger. Therefore, it is preferable that the trench gate structures be arranged such that the spacing between adjacent trench gate structures is larger.

Fourth Embodiment

A super junction semiconductor device according to a fourth embodiment of the present invention is described below with reference to FIG. 4. Differences between the third and fourth embodiments are as follows. In the third embodiment, as shown in FIG. 3B, the p-type body region 70 is located near the trench gate structure so that a distance between the p-type body region 70 and the trench gate structure is relatively small. Therefore, an avalanche current may affect a semiconductor element formed in the semiconductor device.

Figure 4:
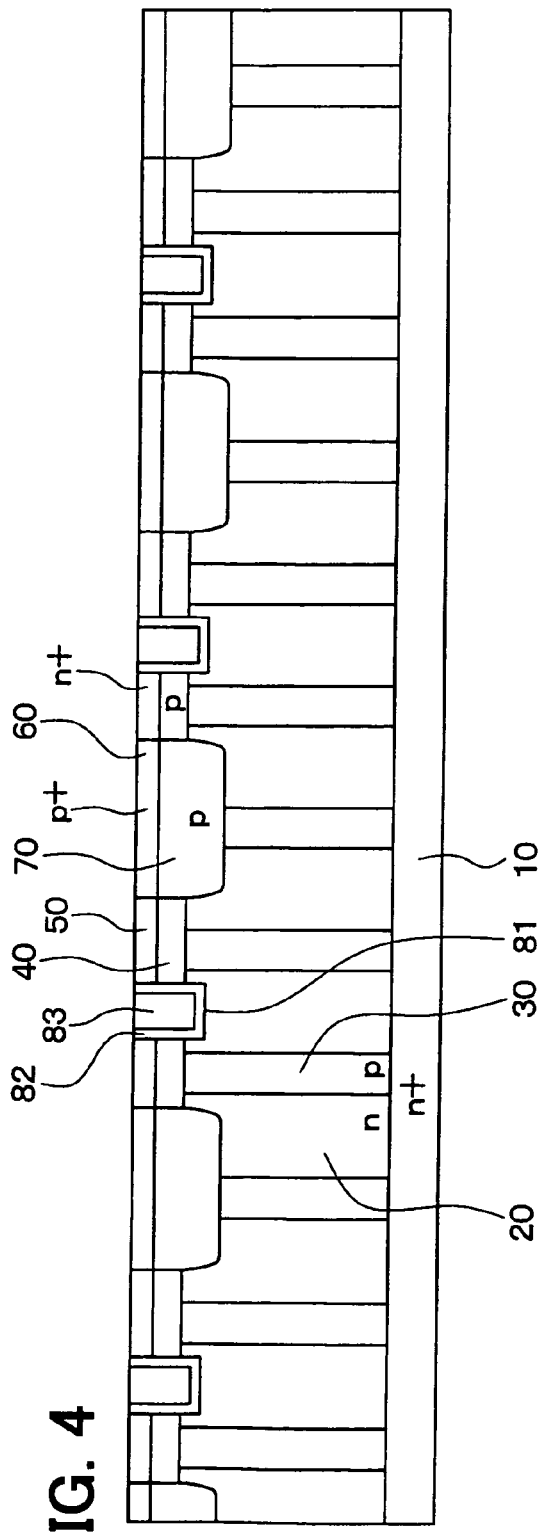
FIG. 4 is a diagram illustrating a cross sectional view of a semiconductor device according to a fourth embodiment of the present invention.

In the fourth embodiment, as shown in FIG. 4, a p-type body region 70 is located away from a trench gate structure so that a distance between the p-type body region 70 and the trench gate structure is relatively large. Like the third embodiment, spacing between adjacent trench gate structures is three times spacing between adjacent column structures. However, a width of the p-type body region 70 is small as compared to that of the third embodiment. Specifically, the p-type body region 70 is not in contact with a first n-column 20 to which the trench gate structure is formed. Further, the p-type body region 70 is not in contact with a p-column 30 located adjacent to the first n-column 20. In other words, the p-type body region 70 is in contact with a column structure located between the p-columns 30 located adjacent to the first n-columns 20.

As described above, according to the fourth embodiment, the p-type body region 70 is located away from the trench gate structure. In such an approach, a path over which the avalanche current flows to the p+-type region 60 by way of the p-type body region 70 can be located away from the trench gate structure. Therefore, the semiconductor device can have a more improved avalanche capability.

Fifth Embodiment

A super junction semiconductor device according to a fifth embodiment of the present invention is described below with reference to FIG. 5. Differences between the fourth and fifth embodiments are as follows. In the preceding embodiments including the fourth embodiment, the charge balance condition between the n-column 20 and the p-column 30 are matched.

In the fifth embodiment, charge balance condition between an n-column 20 and a p-column 30 are mismatched. As shown in FIG. 5, a width of a p-column 30 that is in contact with a p-type body region 70 is smaller than a width of a p-column 30 located adjacent to a first n-column 20. Specifically, a width of each of first and second n-columns 20 is 1.7 µm, a width of a p-column 30 located adjacent to the first n-column 20 is 1.0 µm, a width of a p-column 30 that is in contact with the p-type body region 70 is 0.8 µm.

The number of n-type carriers in the first n-column 20 is equal to the number of p-type carriers in the p-column 30 located adjacent to the first n-column 20. Thus, the semiconductor device can have an improved breakdown voltage. In contrast, the number of n-type carriers in the second n-column 20 is greater than the number of p-type carriers in the p-column 30 that is in contact with the p-type body region 70 and located between the second n-columns 20. This structure may cause a breakdown to occur at a lower voltage. However, this structure can allow the breakdown to occur at a portion, which is indicated by a circle in FIG. 5, directly below the p-type body region 70. Specifically, the breakdown occurs at an upper portion of the p-column 30 that is in contact with the p-type body region 70.

Figure 5:
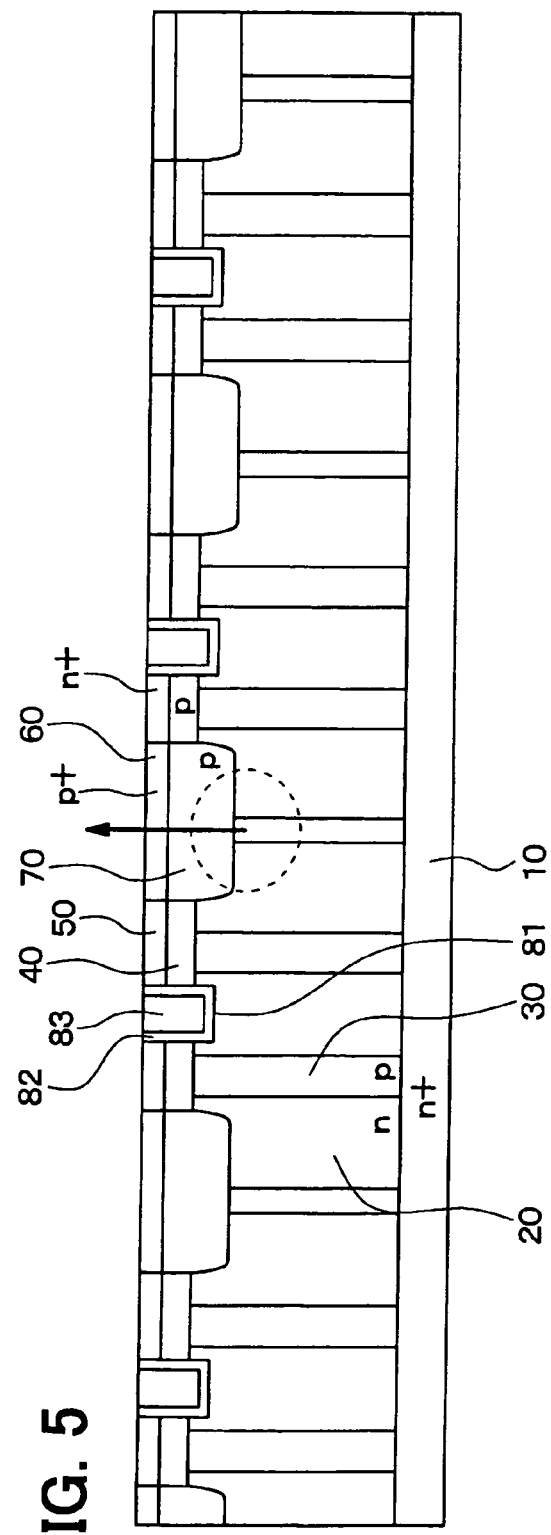
FIG. 5 is a diagram illustrating a cross sectional view of a semiconductor device according to a fifth embodiment of the present invention.

An avalanche current due to the breakdown flows from the p-column 30 directly to the p-type body region 70, as indicated by an arrow in FIG. 5. Therefore, a parasitic bipolar transistor action does not occur so that the semiconductor device can have an improved avalanche capability.

As describe above, according to the fifth embodiment, the width of the p-column 30 that is in contact with the p-type body region 70 is smaller than the width of the p-column 30 located adjacent to the first n-column 20. In such an approach, the charge balance condition between the n-column 20 and the p-column 30 of the column structure that is in contact with the p-type body region 70 can be mismatched. Therefore, the avalanche breakdown occurs at the upper portion of the p-column 30 that is in contact with the p-type body region 70. An avalanche current due to the breakdown flows from the p-column 30 directly to the p-type body region 70. Thus, the avalanche current can be prevented from flowing to the first n-column 20 so that the semiconductor device can have an improved avalanche capability.

The effect of the fifth embodiment is obtained by setting the width of the p-column 30 that is in contact with the p-type body region 70 to smaller than the width of the p-column 30 located adjacent to the first n-column 20. Alternatively, the same effect can be obtained by setting the width of the second n-column 20 to greater than the width of the first n-column 20.

Sixth Embodiment

A super junction semiconductor device according to a sixth embodiment of the present invention is described below with reference to FIG. 6. Differences between the fifth and sixth embodiments are as follows. In the fifth embodiment, the width of the p-column 30 that is in contact with the p-type body region 70 is smaller than the width of the p-column 30 located adjacent to the first n-column 20.

Conversely, in the sixth embodiment, a width of a p-column 30 that is in contact with a p-type body region 70 is greater than a width of a p-column 30 located adjacent to a first n-column 20. Specifically, as shown in FIG. 6, a width of each of first and second n-columns 20 is 1.7 µm, the width of the p-column 30 located adjacent to the first n-column 20 is 1.0 µm, the width of a p-column 30 that is in contact with the p-type body region 70 is 1.2 µm.

The number of n-type carriers in the first n-column 20 is equal to the number of p-type carriers in the p-column 30 located adjacent to the first n-column 20. In contrast, the number of n-type carriers in the second n-column 20 is less than the number of p-type carriers in the p-column 30 that is in contact with the p-type body region 70 and located between the second n-columns 20. This structure may cause a breakdown to occur at a lower voltage. However, this structure can allow the breakdown to occur at a lower portion, which is indicated by a circle in FIG. 6, of the p-column 30 that is in contact with the p-type body region 70. Specifically, the breakdown occurs at a substrate 10 side of the p-column 30 that is in contact with the p-type body region 70. An avalanche current due to the breakdown flows from the p-column 30 directly to the p-type body region 70, as indicated by an arrow in FIG. 6. Therefore, a parasitic bipolar transistor action does not occur so that the semiconductor device can have an improved avalanche capability.

The effect of the sixth embodiment is obtained by setting the width of the p-column 30 that is in contact with the p-type body region 70 to greater than the width of the p-column 30 located adjacent to the first n-column 20. Alternatively, the same effect can be obtained by setting the width of the second n-column 20 to less than the width of the first n-column 20.

Seventh Embodiment

A super junction semiconductor device according to a seventh embodiment of the present invention is described below with reference to FIG. 7. Differences between the preceding embodiments and the seventh embodiment are as follows. For example, as shown in FIG. 2, in the preceding embodiments, one trench gate structure and one p-type body region 70 are alternately arranged so that one trench gate structure is located between adjacent p-type body regions 70. Thus, the trench gate structures are arranged at regular spacings. In the seventh embodiment, multiple trench gate structure and one p-type body regions 70 are alternately arranged so that multiple trench gate structures are located between adjacent p-type body regions 70. For example, as shown in FIG. 7, two trench gate structures are located between adjacent p-type body regions 70. Thus, the trench gate structures are arranged at irregular spacings.

In other words, the trench gate structures are arranged in a first pattern where the trench gate structures are tightly arranged and a second pattern where the trench gate structures are loosely arranged. In the first pattern, one trench gate structure is formed to every column structure. In the second pattern, one trench gate structure is formed to every two or more column structures. One p-type body region 70 is formed between adjacent trench gate structures that are arranged in the second pattern. In such an approach, the p-type body region 70 can have larger size and depth so that the semiconductor device can have an improved avalanche capability. Further, since an electric current flow can be concentrated at a portion where the trench gate structures are arranged in the first pattern, on-resistance can be small.

Eighth Embodiment

A super junction semiconductor device according to an eighth embodiment of the present invention is described below with reference to FIG. 8. Differences between the preceding embodiments and the eighth embodiment are as follows. In the preceding embodiments, a length direction of the trench gate structure is orthogonal to an arrangement direction in which the n-column 20 and the p-column 30 are alternately arranged, so that the plane direction of the interface between the n-column 20 and the p-column 30 is parallel to the length direction of the trench gate structure. In contrast, in the eighth embodiment, a length direction of a trench gate structure is parallel to an arrangement direction in which an n-column 20 and a p-column 30 are alternately arranged, so that a plane direction of an interface between the n-column 20 and the p-column 30 is orthogonal to the length direction of the trench gate structure.

Figure 8:
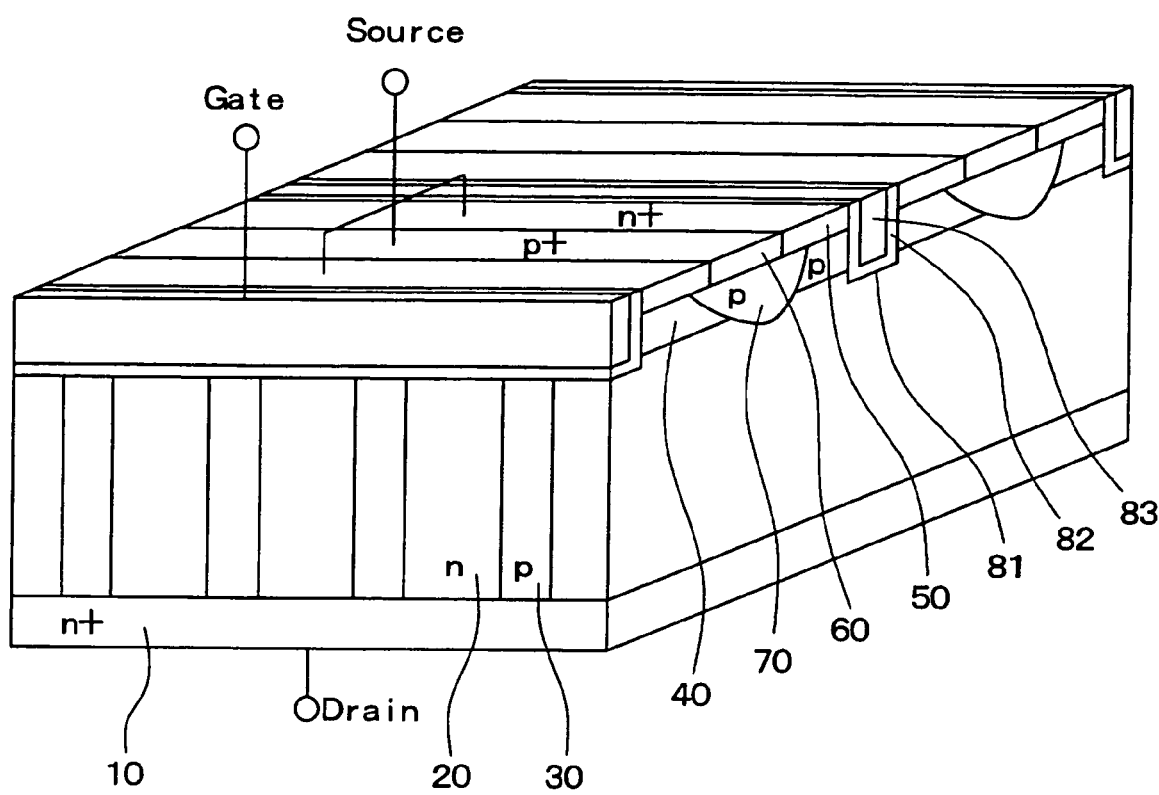
FIG. 8 is a diagram illustrating a cross sectional view of a semiconductor device according to an eighth embodiment of the present invention.

As shown in FIG. 8, a super junction structure constructed with the n-column 20 and the p-column 30 is formed on an n+-type substrate 10. A p-type channel layer 40 is formed to a surface portion of the super junction structure.

A trench 81 reaches the super junction structure by penetrating through the p-type channel layer 40. A length direction of the trench 81 is parallel to the arrangement direction in which the n-column 20 and the p-column 30 are alternately arranged. Therefore, a plane direction of an interface between the n-column 20 and the p-column 30 is orthogonal to the length direction of the trench 81. An inner wall of the trench 81 is covered with a gate insulating film 82, and a gate electrode 83 is formed in the trench 81 through the gate insulating film 82. Thus, the trench 81, the gate insulating film 82, and the gate electrode 83 form the trench gate structure.

An n+-type source region 50 is formed to a surface portion of the p-type channel layer 40 and located near an outer side wall of the trench 81. A p+-type region 60 is formed to the surface portion of the p-type channel layer 40 between the n+-type source regions 50.

A p-type body region 70 is located between adjacent trench gate structures. The p-type body region 70 is formed to the p-type channel layer 40 and reaches the super junction structure by penetrating through the p-type channel layer 40.

In the preceding embodiments, since the trench gate structure is formed on the n-column 20 of the column structure, the spacing between adjacent trench gate structures must be an integral multiple of the spacing between adjacent n-columns 20. In contrast, according to the eighth embodiment, spacing between adjacent trench gate structures can be flexibly determined. Therefore, parameters such as a gate-drain charge Qgd and a product (i.e., Ron×Qgd) of an on-resistance Ron and the gate-drain charge Qgd can be optimized to increase an avalanche capability.

Ninth Embodiment

A super junction semiconductor device according to a ninth embodiment of the present invention is described below with reference to FIGS. 9A, 9B. The present inventor has investigated a relationship between a parameter Ron×Qgd and a ratio of spacing between adjacent trench gate structures to spacing between adjacent column structures, using the semiconductor device shown in FIG. 8. Further, the present inventor has investigated a relationship between a source-drain saturation current Isat and the ratio of the gate spacing to the column spacing, using the semiconductor device shown in FIG. 8.

Figure 9A:
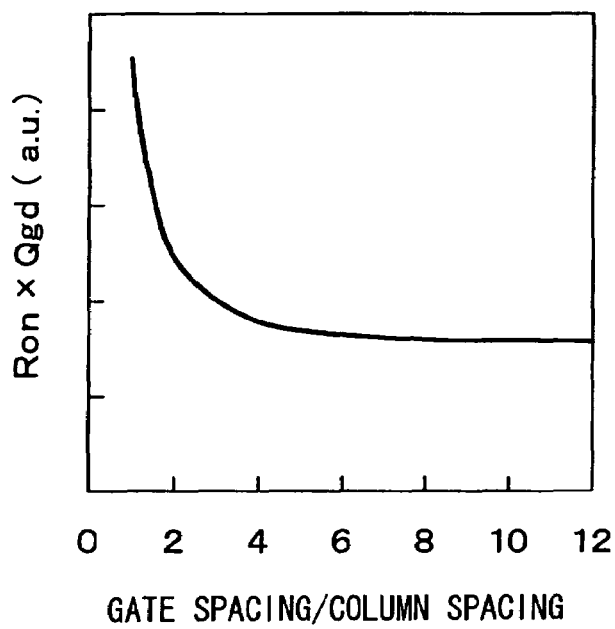
FIG. 9A is a diagram illustrating a relationship between a parameter Ron×Qgd and a ratio of spacing between adjacent trench gate structures to spacing between adjacent column structures.
Figure 9B:
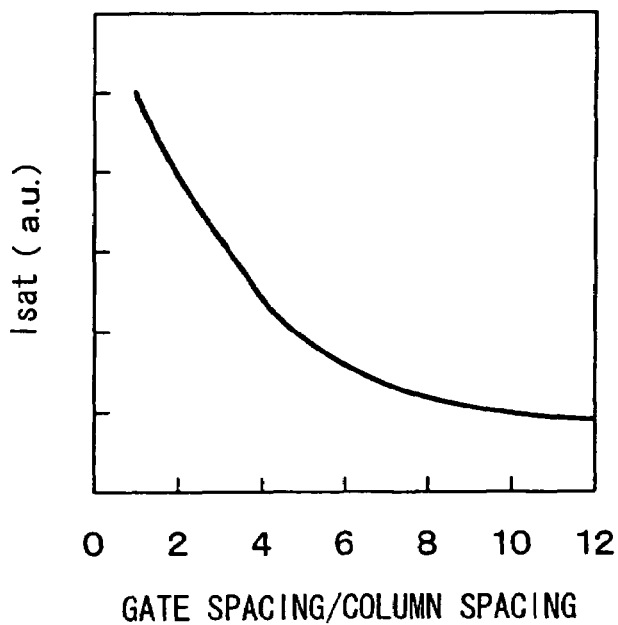
FIG. 9B is a diagram illustrating a relationship between a saturation current and the ratio of spacing between adjacent trench gate structures to spacing between adjacent column structures.

FIG. 9A shows the relationship between the parameter Ron×Qgd and the ratio of the gate spacing to the column spacing, and FIG. 9B shows the relationship between the saturation current Isat and the ratio of the gate spacing to the column spacing. As the parameter Ron×Qgd is smaller, a semiconductor device can operate faster. Therefore, it is preferable that the parameter Ron×Qgd be small.

As shown in FIG. 9A, the parameter Ron×Qgd is saturated (i.e., constant) in a range where the ratio of the gate spacing to the column spacing is equal to or greater than eight. In contrast, as shown in FIG. 9B, the saturation current Isat decreases with an increase in the ratio of the gate spacing to the column spacing in the range where the ratio of the gate spacing to the column spacing is equal to or greater than eight. The decrease in the saturation current Isat causes the need to increase a chip size. Therefore, it is preferable that the ratio of the gate spacing to the column spacing is equal to or less than eight. In other words, it is preferable that one trench gate structure is formed to every eight or less column structures.

The present inventor has confirmed that the relationships shown in FIGS. 9A, 9B also apply to the semiconductor devices shown in FIGS. 1-7. As previously described, in the semiconductor device shown in FIG. 7, the trench gate structures are arranged at irregular spacing. In the case of FIG. 7, an average of the irregular spacings is calculated, and the ratio of the gate spacing to the column spacing is calculated using the calculated average. The average of the irregular spacings is an average of distances between the centers of adjacent trench gate structures.

MODIFICATIONS

The embodiments described above may be modified in various ways. For example, the width and the impurity concentration specified in the embodiments can be changed according to individual designs. It is preferable that the depth of the p-type body region 70 be greater than the depth of the trench 81 of the trench gate structure as shown in FIG. 2. Alternatively, the depth of the p-type body region 70 can be less than or equal to the depth of the trench 81 of the trench gate structure as shown in FIG. 3A. The embodiments can be combined together according to needs. For example, the eighth embodiment can be combined with each of the first to seventh embodiments. Specifically, in each of the first to seventh embodiments, the plane direction of the interface between the n-column 20 and the p-column 30 can be orthogonal to the length direction of the trench gate structure.

Such changes and modifications are to be understood as being within the scope of the present invention as defined by the appended claims.

What is claimed is:

1. A semiconductor device comprising:
a first conductive type substrate;
a super junction layer disposed on the substrate and including a plurality of first conductive type first regions and a plurality of second conductive type second regions, the first and second regions being alternately arranged in a plane direction of the substrate;
a second conductive type channel layer formed to a surface portion of the super junction layer;
a plurality of trench gate structures, each of which includes a trench, a gate insulating layer, and a gate electrode, the trench penetrating through the channel layer and reaching a corresponding one of the plurality of first regions of the super junction layer, the gate insulating layer being disposed on an inner wall of the trench, the gate electrode being disposed in the trench through the gate insulating layer;
a first conductive type source region formed to a surface portion of the channel layer and located near an outer side wall of the trench;
a second conductive type third region formed to the surface portion of the channel layer and located between adjacent source regions, the third region having an impurity concentration greater than an impurity concentration of the channel layer; and
a second conductive type body region formed to the channel layer between adjacent trench gate structures and being in contact with the third region.

2. The semiconductor device according to claim 1, wherein the plurality of first and second regions of the super junction layer forms a plurality of column structures, each of which includes one first region and one second region adjacent to the one first region, and wherein
one trench gate structure is formed to every two or more column structures.

3. The semiconductor device according to claim 2, wherein one trench gate structure is formed to every eight or less column structures.

4. The semiconductor device according to claim 1, wherein the body region reaches the super junction layer.

5. The semiconductor device according to claim 1, wherein a depth of the body region is greater than a depth of the trench, and wherein
each depth is measured from a surface of the semiconductor device.

6. The semiconductor device according to claim 1, wherein a plane direction of an interface between the first and second regions of the super junction layer is in parallel to a length direction of the trench gate structure.

7. The semiconductor device according to claim 1, wherein the body region is not in contact with the first regions to which the trench gate structures are respectively formed, wherein
the body region is not in contact with second regions that are respectively located adjacent to the first regions, wherein
at least two first regions and at least one second region sandwiched between the at least two first regions are located between the second regions with which the body region is not in contact, and wherein
the body region is in contact with the at least one second region.

8. The semiconductor device according to claim 1, wherein the number of carriers in the first region to which the trench gate structure is formed is equal to the number of carriers in each second region located adjacent to the first region, and wherein
the number of carriers in each of the first regions that are in contact with the body region is greater than the number of carriers in the second region that is in contact with the body region and sandwiched between the first regions that are in contact with the body region.

9. The semiconductor device according to claim 1, wherein the width of the second region that is in contact with the body region is less than the width of each second region located adjacent to the first region to which the trench gate structure is formed.

10. The semiconductor device according to claim 1, wherein
the number of carriers in the first region to which the trench gate structure is formed is equal to the number of carriers in each second region located adjacent to the first region, and wherein
the number of carriers in the second region that is in contact with the body region is greater than the number of carriers in each first region located adjacent to the second region that is in contact with the body region.

11. The semiconductor device according to claim 1, wherein
the width of the second region that is in contact with the body region is greater than the width of each second region located adjacent to the first region to which the trench gate structure is formed.

12. A semiconductor device comprising:
a first conductive type substrate;
a super junction layer disposed on the substrate and including a plurality of first conductive type first regions and a plurality of second conductive type second regions, the first and second regions being alternately arranged in a plane direction of the substrate;
a second conductive type channel layer formed to a surface portion of the super junction layer;
a plurality of trench gate structures, each of which including a trench, a gate insulating layer, and a gate electrode, the trench penetrating through the channel layer and reaching a corresponding one of the plurality of first regions of the super junction layer, the gate insulating layer being disposed on an inner wall of the trench, the gate electrode being disposed in the trench through the gate insulating layer;

a first conductive type source region formed to a surface portion of the channel layer and located near an outer side wall of the trench;

a second conductive type third region formed to the surface portion of the channel layer and located between adjacent source regions, the third region having an impurity concentration greater than an impurity concentration of the channel layer; and a second conductive type body region formed to the channel layer between adjacent trench gate structures and being in contact with the third region, wherein the plurality of first and second regions of the super junction layer forms a plurality of column structures, each of which includes one first region and one second region adjacent to the one first region, wherein the plurality of trench gate structures is arranged in a first pattern where one trench gate structure is formed to every column structure and arranged in a second pattern where one trench gate structure is formed to every two or more column structures, and wherein the body region is formed to the channel layer between adjacent trench gate structures arranged in the second pattern.

13. The semiconductor device according to claim 12, wherein in the second pattern, one trench gate structure is formed to every eight or less column structures.

14. The semiconductor device according to claim 12, wherein the body region reaches the super junction layer.

15. The semiconductor device according to claim 12, wherein a depth of the body region is greater than a depth of the trench, and wherein each depth is measured from a surface of the semiconductor device.

16. A semiconductor device comprising:

a first conductive type substrate;

a super junction layer disposed on the substrate and including a plurality of first conductive type first regions and a plurality of second conductive type second regions, the first and second regions being alternately arranged in a plane direction of the substrate;

a second conductive type channel layer formed to a surface portion of the super junction layer;

a plurality of trench gate structures, each of which including a trench, a gate insulating layer, and a gate electrode, the trench penetrating through the channel layer and reaching a corresponding one of the plurality of first regions of the super junction layer, the gate insulating layer being disposed on an inner wall of the trench, the gate electrode being disposed in the trench through the gate insulating layer;

a first conductive type source region formed to a surface portion of the channel layer and located near an outer side wall of the trench;

a second conductive type third region formed to the surface portion of the channel layer and located between adjacent source regions, the third region having an impurity concentration greater than an impurity concentration of the channel layer; and a second conductive type body region formed to the channel layer between adjacent trench gate structures and being in contact with the third region, wherein a plane direction of an interface between the first and second regions of the super junction layer is orthogonal to a length direction of the trench gate structure.

17. The semiconductor device according to claim 16, wherein the body region reaches the super junction layer.

18. The semiconductor device according to claim 16, wherein a depth of the body region is greater than a depth of the trench, and wherein each depth is measured from a surface of the semiconductor device.

19. The semiconductor device according to claim 16, wherein the plurality of first and second regions of the super junction layer forms a plurality of column structures, each of which includes one first region and one second region adjacent to the one first region, and wherein a ratio of spacing between adjacent trench gate structures to spacing between adjacent column structures is equal to or less than eight.

* * * * *